United States Patent [19]

Koga et al.

[11] Patent Number: 5,142,698
[45] Date of Patent: Aug. 25, 1992

[54] MICROWAVE INTEGRATED APPARATUS INCLUDING ANTENNA PATTERN FOR SATELLITE BROADCASTING RECEIVER

[75] Inventors: Hisayoshi Koga; Hiroshi Watanabe, both of Tokyo, Japan

[73] Assignee: NEC Corporation, Japan

[21] Appl. No.: 362,380

[22] Filed: Jun. 7, 1989

[30] Foreign Application Priority Data

Jun. 8, 1988 [JP] Japan .................. 63-142323
Jun. 8, 1988 [JP] Japan .................. 63-142324

[51] Int. Cl.⁵ .................. H04B 1/26; H04B 1/06; H01Q 1/26
[52] U.S. Cl. .................. 455/327; 455/328; 455/281; 343/700 MS
[58] Field of Search .................. 455/281, 327-328, 455/323, 272; 333/21 A, 21 R, 26, 248; 343/700 MS

[56] References Cited

U.S. PATENT DOCUMENTS

| | | | |
|---|---|---|---|
| 4,079,268 | 3/1978 | Fletcher et al. | 343/700 MS |
| 4,142,190 | 2/1979 | Kerr | 343/700 MS |
| 4,195,301 | 3/1980 | Conroy | 343/700 MS |
| 4,596,047 | 6/1986 | Watanabe et al. | 455/327 |
| 4,607,394 | 8/1986 | Nightingale | 455/327 |
| 4,918,749 | 4/1990 | Entschladen et al. | 455/327 |

Primary Examiner—Curtis Kuntz
Assistant Examiner—Andrew Faile
Attorney, Agent, or Firm—Ostrolenk, Faber, Gerb & Soffen

[57] ABSTRACT

A microwave integrated apparatus, particularly useful for a satellite broadcasting receiver, comprises a housing having a radiation aperture and being electromagnetically shielded except for the radiation aperture. An insulated substrate is disposed in the housing, and has formed thereon an antenna pattern capable of receiving or radiating microwaves through the radiation aperture of the housing. A signal-processing means is disposed beside the insulated substrate in the housing, and is connected to the antenna pattern on the insulated substrate. For achieving a microwave circuit arrangement having excellent performance characteristic of a very wide frequency range, a second antenna pattern is disposed at the radiation aperture of the housing, and in proximity to the above-mentioned antenna pattern.

18 Claims, 3 Drawing Sheets

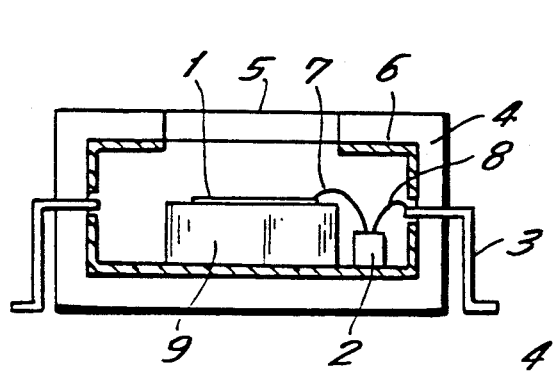
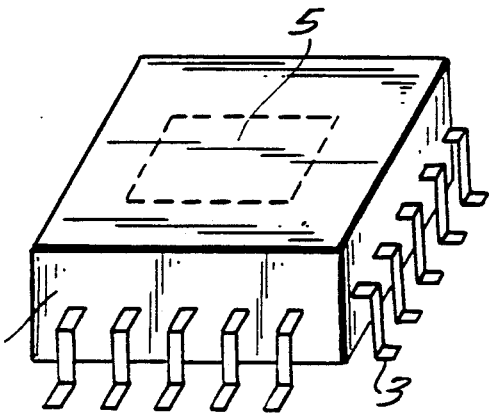
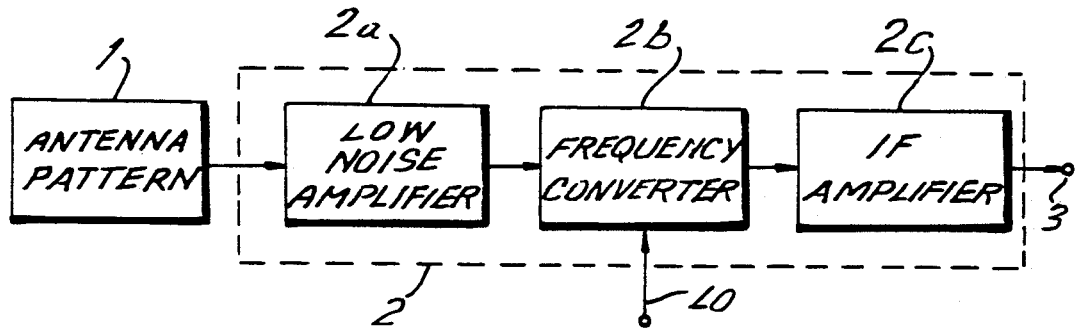
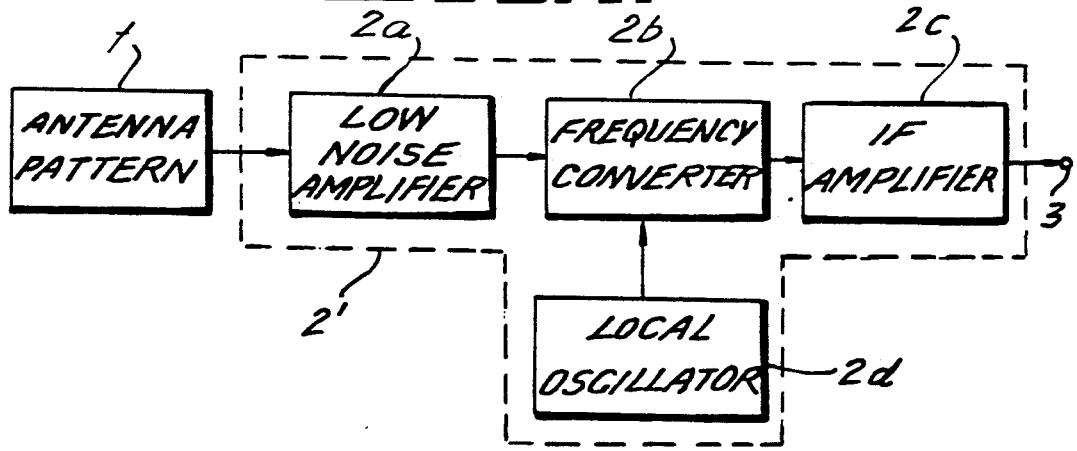

FIG. 5a.
FIG. 5c.
 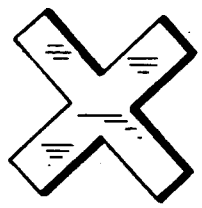 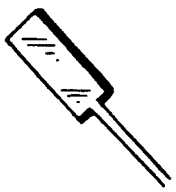 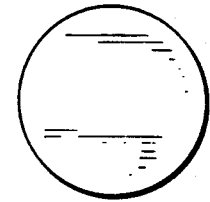
FIG. 5b.
FIG. 5d.
FIG. 5e.
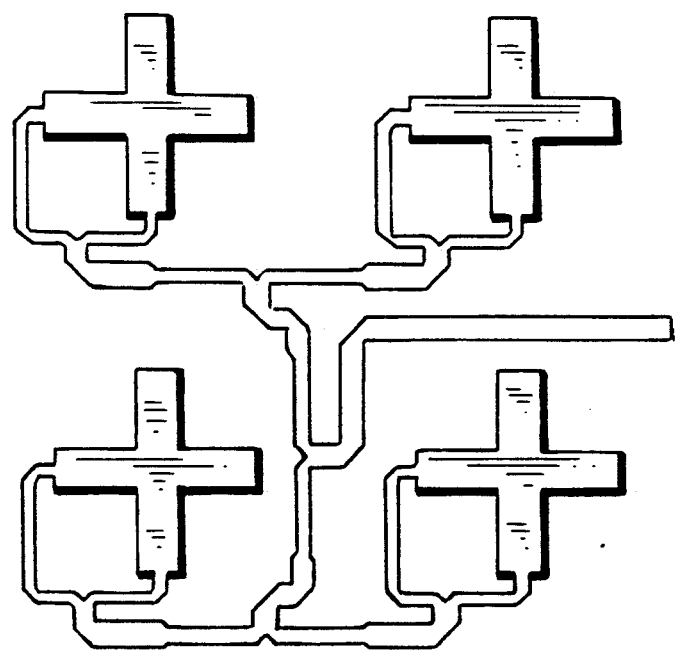

1

MICROWAVE INTEGRATED APPARATUS INCLUDING ANTENNA PATTERN FOR SATELLITE BROADCASTING RECEIVER

BACKGROUND OF THE INVENTION

This invention relates to a microwave circuit arrangement such as an antenna-converter arrangement for a satellite broadcasting receiver and, more particularly, to a microwave integrated apparatus that can be applied to such satellite broadcasting receiver.

A conventional microwave circuit arrangement for a satellite broadcasting receiver is disclosed in U.S. Pat. No. 4,596,047, issued on Jun. 17, 1986 and assigned to the applicant of the present invention. This arrangement includes a parabolic reflector, a primary radiator (hereinafter referred to as a "horn") located at the focus of the parabolic reflector and a frequency converter connected to the horn. Further, the frequency converter includes a printed-circuit board accommodated into a metallic case. Generally, the printed-circuit board is a discrete circuit structure that comprises a microstrip line circuit formed on a Teflon glass cloth substrate, and a large number of discrete circuit components such as transistors, diodes, resistors, capacitors, etc. Furthermore, the horn and the printed-circuit board are connected to each other through a waveguide - stripline transducer.

Therefore, the above-mentioned conventional circuit arrangement involves the drawbacks such as the need of long assembly time, high production cost, a complicated structure, relatively high signal loss, and inadequate performance characteristics due to many connecting portions. Further, the use of the horn and the converter leads to an antenna-converter arrangement of large size and high cost.

SUMMARY OF THE INVENTION

It is therefore an object of the present invention to provide a microwave integrated apparatus for a satellite broadcasting receiver that can remarkably reduce the size of a part corresponding to a horn and a converter.

It is another object of the present invention to provide a microwave integrated apparatus for a satellite broadcasting receiver that can be assembled extremely easily as a receiver but has high performance.

The present invention eliminates the drawbacks of the prior art on the basis of an entirely novel concept.

In accordance with one aspect of the invention, there is provided a microwave integrated apparatus comprising a housing having a radiation aperture, the housing being electromagnetically shielded except for the radiation aperture; an insulated substrate disposed in the housing; an antenna pattern formed on the insulated substrate, the antenna pattern being capable of receiving or radiating a microwave signal through the radiation aperture of the housing; and a signal processing circuit disposed beside the insulated substrate in the housing, the signal processing circuit being connected to the antenna pattern on the insulated substrate.

In accordance with another aspect of the present invention, there is provided a microwave integrated apparatus further comprising a second antenna pattern in addition to the microwave integrated apparatus of the first aspect, the second antenna pattern being disposed at the radiation aperture of the housing.

BRIEF DESCRIPTION OF THE DRAWINGS

Other features and advantages of the present invention will become apparent from the following description of the invention which refers to the accompanying drawings, in which:

FIG. 1 is a sectional view of an embodiment according to the present invention;

FIG. 2 is a perspective view showing the appearance of a microwave integrated apparatus of the embodiment shown in FIG 1;

FIG. 3 is a block diagram showing a signal processing circuit contained in the embodiment of the present invention;

FIG. 4 is a block diagram showing another signal processing circuit contained in the embodiment of the present invention;

FIGS. 5(a) to 5(e) are plan views showing examples of antenna patterns to be applied to the present invention;

DESCRIPTION OF THE PREFERRED EMBODIMENTS

Figure 6:
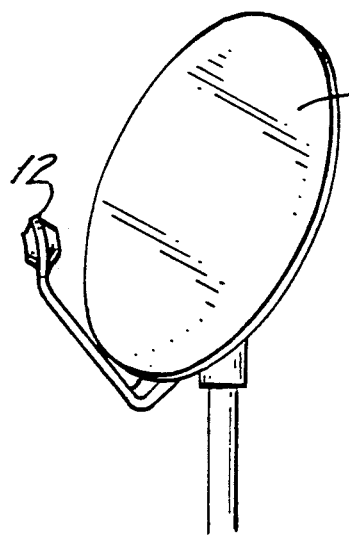
FIG. 6 is a perspective view showing a structural example of a satellite broadcasting receiver using the microwave integrated apparatus of the present invention.

As shown in FIGS. 1 and 2, a microwave integrated apparatus of the present invention comprises an antenna pattern 1; a frequency converting circuit 2 comprising a monolithic microwave integrated circuit (hereinafter referred to as a MIC), for example; a plurality of terminals 3; and a sealed housing (hereinafter referred to as a case) 4. A metallic film of metallization or metal 6 is applied to the interior of the case 4 except for a portion near a radiation aperture 5 and the terminals 3, for protection from ultraviolet rays and for electromagnetic shielding. The radiation aperture 5 is made of a material that permits the passage of a microwave signal and maintains air-tightness such as glass, ceramics or plastics.

The incident microwave signal through the radiation aperture 5 is received by the antenna pattern 1. After this, it is amplified and frequency-converted by the frequency converting circuit 2 through a bonding wire 7. The frequency-converted signal, i.e. intermediate frequency (IF) signal is outputted from the terminals 3 through the bonding wire 8.

Such a microwave integrated apparatus can be fabricated by a fabrication and assembly process similar to those of ordinary semiconductor devices, such as semiconductor memories and charge coupled (CCD) imaging devices. Accordingly, it can be supplied economically through mass production with high producibility by automatic assembly.

In FIG. 3 showing a block diagram of the microwave integrated apparatus of the present invention, the frequency converting circuit or signal processing circuit 2 includes a low noise amplifier 2a, a frequency converter 2b and an intermediate frequency amplifier 2c. The frequency converter 2b frequency-converts the amplified microwave signal by a local oscillation signal LO applied thereto from outside and provides the IF signal having a relatively low frequency.

In FIG. 4 showing another block diagram of the microwave integrated apparatus of the present invention, a frequency converting circuit 2' includes a local oscillator 2d in addition to the circuit arrangement shown in FIG. 3.

FIGS. 5(a) to 5(e) show some examples of antenna patterns to be applied to the microwave integrated apparatus of the present invention. In the drawing, FIG. 5(a) shows a spiral pattern; FIG. 5(b) shows a cross-dipole pattern; FIG. 5(c) shows a ¼ wavelength tip-open-line pattern; FIG. 5(d) shows a patch pattern; and FIG. 5(e) shows a combined pattern including a plurality of antenna patterns, particularly a plurality of the cross-dipole patterns. The combined pattern is capable of increasing the antenna gain. An optimum antenna pattern is selected depending on the polarization of the microwave radiation applied therewith, such as a circular polarized wave or a linear polarized wave.

As shown in FIG. 1 antenna pattern is formed on an insulation substrate 9 such as an alumina ceramics by a thick or thin film technique and mounted into the case 5. Further, the substrate 9 may be a semiconductor substrate such as a Si or GaAs substrate constituting the microwave integrated apparatus, and, in this case, it is possible to form the frequency converting circuit 2 on this semiconductor substrate 9 along with the antenna pattern, by a semiconductor integration technique. Thus, in this case, the bonding wire 7 between the antenna pattern 1 and the frequency converting circuit 2 can be omitted since a conductive pattern on the semiconductive substrate 9 is applied instead of the bonding wire 7. Therefore, assembly of the microwave integrated apparatus can be further simplified. Further, since any degradation of characteristics due to connecting portions can be eliminated, a microwave integrated apparatus having good performance characteristics can be accomplished.

FIG. 6 shows a structural example of an antenna-converter arrangement using the microwave integrated apparatus according to the present invention. In this figure, a converter unit 12 is disposed at the focal point of a parabolic reflector 11.

Figure 7:
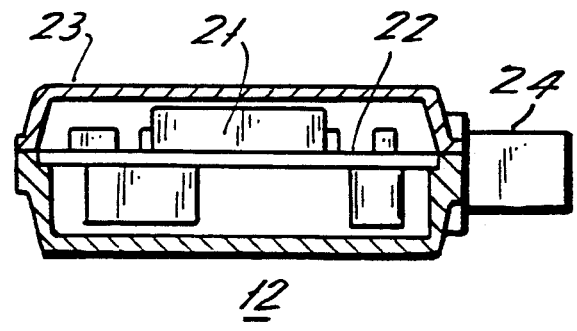
FIG. 7 is a sectional view of a converter part of the satellite broadcasting receiver shown in FIG. 6.

FIG. 7 shows a sectional view of the converter unit 12 shown in FIG. 6. In FIG. 7, the microwave integrated apparatus 21 of the present invention is mounted together with other circuit components such as a power source stabilization circuit. Reference numeral 23 represents a housing of the converter unit 12 which is made of a material permitting the passage of a microwaves, such as plastic, and it supports a printed-circuit board 22 and a signal connector 24. As shown in FIGS. 6 and 7, the antenna-converter arrangement using the microwave integrated apparatus of the present invention does not require the horn including the waveguide and a waveguide-coaxial transducer or a waveguide-stripline transducer that have been necessary conventionally, and is therefore extremely simple in structure. Moreover, according to the present invention, since the microwave signal is substantially processed inside the microwave integrated apparatus 21 according to the present invention and the IF signal is outputted to the outside, the circuit configuration of peripheral circuits can be simplified remarkably. Further, an economical material such as a phenol substrate can be used for the printed-circuit board 22 in place of expensive Teflon glass-cloth substrate. Thus, the present invention can provide an antenna-converter arrangement that is simple, compact, economical and easy-to-assemble.

Next, a second embodiment of the present invention will be described in detail with reference to FIGS. 8 and 9.

Figure 8:
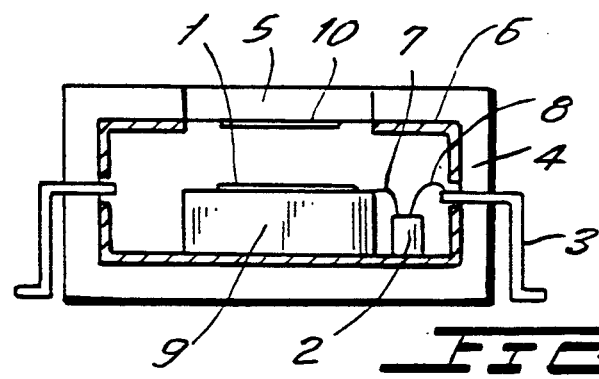
FIG. 8 is a sectional view of a second embodiment according to the present invention.
Figure 9:
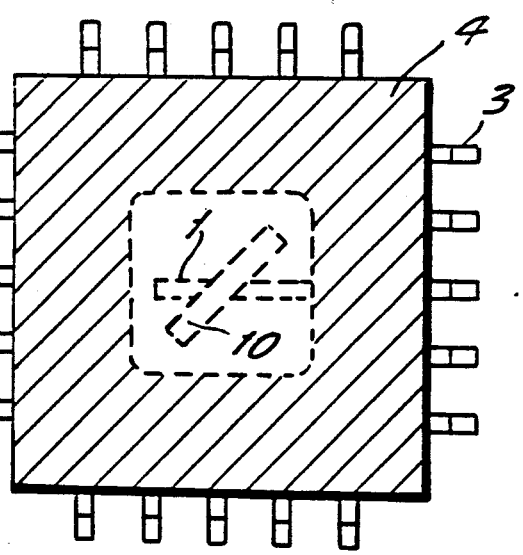
FIG. 9 is a plan view showing the appearance of the second embodiment shown in FIG. 8.

In FIGS. 8 and 9, the microwave integrated apparatus includes an antenna pattern 1, a frequency converting circuit 2 comprising a monolithic microwave integrated circuit (hereinafter referred to as a MIC) chip, for example, a plurality of terminals 3 and a sealed housing (hereinafter referred to as a case) 4, the same as in FIG. 1.

In this embodiment, another antenna pattern 10, separate from the antenna pattern 1, is disposed at the radiation aperture 5. Therefore, an incident microwave signal passed through this radiation aperture 5 first excites this antenna pattern 10 and is then received by the antenna pattern 1, which is coupled electromagnetically with the antenna pattern 10. After this, the received microwave signal is amplified and subjected to frequency conversion by the frequency converting circuit 2, comprising the MIC chip through a bonding wire 7 and then outputted from the terminal 3 through the bonding wire 8.

Thus, since the microwave signal is received by the combination of the antenna pattern 1 and at least one antenna pattern 10, excellent antenna radiation efficiency can be obtained over a wide frequency range by selecting a resonance frequency of each antenna pattern and a coupling coefficient between them in that the antenna pattern 1 and the antenna pattern 10 effect double-resonance.

Particularly, by constituting the antenna pattern 10 as a circular polarization wave generation resonance element such as a circular patch pattern (FIG. 5(d)), constituting the antenna pattern 1 as an excitation element such as a ¼ wavelength tip-open-line pattern (FIG. 5(c)), a good circular-polarization antenna-radiation characteristic can be obtained.

The antenna pattern 10, as shown in FIG. 8, is formed inside the case 4 by thick film technique or a metallization technique. Further, (not shown) may be alternatively formed on the outer wall of the case 4 at the radiation aperture 5. In addition, it is possible to place third and more antenna patterns (not shown) outside to couple them with the antenna pattern 10. Furthermore, the microwave integrated apparatus of the present invention can be used as a signal processing means of a phased array antenna by coupling it with the antenna radiation elements of the phased array antenna, for example.

Although the above description concerns the receiver, the present invention can be applied as well to a transmitter in which an IF signal is reversely frequency-converted and power-supplied to be radiated through the antenna pattern, with the structure shown in FIGS. 3 and 4. Obviously, the present invention embraces such case.

In accordance with the present invention described above, there can be obtained a compact, economical microwave transmitter or receiver that is easy to assemble while reducing connecting points and that has a smaller loss but has excellent performance characteristics by incorporating the microwave integrated apparatus of the present invention. Furthermore, according to the present invention, a microwave circuit arrangement having excellent performance characteristics over a wide frequency range can be realized by including more than one antenna pattern.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A microwave integrated apparatus, comprising:
   a housing having a radiation aperture and being electromagnetically shielded except for said radiation aperture;
   an insulated substrate disposed in said housing;
   a first antenna formed on said insulated substrate, said first antenna being capable of receiving or radiating a microwave signal through said radiation aperture of said housing in a microwave radiating direction;
   signal-processing means disposed near said insulated substrate in said housing and connected to said first antenna on said insulated substrate; and
   a second antenna disposed at said radiation aperture of said housing and separated from said first antenna by a predetermined distance in said microwave radiating direction.

2. A microwave integrated apparatus according to claim 1, wherein said signal-processing means includes a frequency-converting circuit performing frequency conversion between said microwave signal and an intermediate frequency signal.

3. A microwave integrated apparatus according to claim 2, wherein said signal-processing means further includes an oscillator generating a local oscillation signal which is supplied to said frequency-converting circuit.

4. A microwave integrated apparatus according to claim 1, wherein a spiral antenna pattern is used as said first antenna.

5. A microwave integrated apparatus according to claim 1, wherein a cross-dipole pattern is used as said first antenna.

6. A microwave integrated apparatus according to claim 1, wherein a ¼ wavelength tip-open-line pattern is used as said first antenna.

7. A microwave integrated apparatus according to claim 1, wherein a patch pattern is used as said first antenna pattern.

8. A microwave integrated apparatus according to claim 1, wherein a micro-strip dipole pattern is used as said second antenna.

9. A microwave integrated apparatus according to claim 1, wherein a cross-dipole pattern is used as said second antenna.

10. A microwave integrated apparatus according to claim 1, wherein a patch pattern is used as said second antenna.

11. The microwave integrated apparatus according to claim 1, further including a parabolic reflector disposed outside of said microwave integrated apparatus, said microwave integrated apparatus being located at a focus position of said parabolic reflector.

12. A microwave integrated apparatus according to claim 1, wherein said first and second antennas are electromagnetically coupled so as to effect double-resonance.

13. A microwave integrated apparatus according to claim 1, wherein said signal-processing means includes an integrated circuit which is formed on said insulated substrate with said first antenna and connected thereto by a conductive pattern on said insulated substrate.

14. A microwave integrated apparatus according to claim 1, wherein said second antenna is formed within said housing.

15. A microwave integrated apparatus according to claim 1, wherein said first antenna is selected from the group consisting of a spiral pattern, a cross-dipole pattern, a ¼-wavelength tip-open-line pattern, and a patch pattern.

16. A microwave integrated apparatus according to claim 15, wherein said second antenna is selected from the group consisting of a micro-strip dipole pattern, a cross-dipole pattern, and a patch pattern.

17. A microwave integrated apparatus according to claim 1, wherein said housing and radiation aperture are capable of guiding microwaves between the exterior of said housing and said first antenna in said microwave radiating direction without requiring any further waveguide.

18. A microwave integrated apparatus, comprising:
    a housing having a radiation aperture and being electromagnetically shielded except for said radiation aperture;
    an insulated substrate disposed in said housing;
    a first antenna pattern formed on said insulated substrate, said first antenna pattern being capable of receiving or radiating a microwave signal through said radiation aperture of said housing in a microwave radiating direction;
    signal-processing means disposed near said insulated substrate in said housing and connected to said first antenna pattern on said insulated substrate;
    a second antenna pattern disposed at said radiation aperture of said housing and separated from said first antenna pattern by a predetermined distance in said microwave radiating direction; and
    wherein said housing and radiation aperture are capable of guiding microwaves between the exterior of said housing and said first antenna pattern in said microwave radiating direction without requiring any further waveguide.

* * * * *